(12) United States Patent
Mandl et al.

(10) Patent No.: US 9,257,611 B2
(45) Date of Patent: Feb. 9, 2016

(54) RADIATION EMITTING OR RECEIVING OPTOELECTRONIC SEMICONDUCTOR CHIP

(71) Applicant: OSRAM Opto Semiconductors GmbH, Regensburg (DE)

(72) Inventors: Martin Mandl, Lappersdorf (DE); Martin Strassburg, Donaustauf (DE); Christopher Kölper, Regensburg (DE); Alexander F. Pfeuffer, Regensburg (DE); Patrick Rode, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/362,155

(22) PCT Filed: Nov. 27, 2012

(86) PCT No.: PCT/EP2012/073729
§ 371 (c)(1),
(2) Date: Jun. 2, 2014

(87) PCT Pub. No.: WO2013/083438
PCT Pub. Date: Jun. 13, 2013

(65) Prior Publication Data
US 2014/0339577 A1   Nov. 20, 2014

(30) Foreign Application Priority Data
Dec. 7, 2011  (DE) .......................... 10 2011 056 140

(51) Int. Cl.
*H01L 29/18* (2006.01)
*H01L 33/44* (2010.01)
(Continued)

(52) U.S. Cl.
CPC .............. *H01L 33/44* (2013.01); *H01L 27/156* (2013.01); *H01L 33/18* (2013.01); *H01L 33/24* (2013.01);
(Continued)

(58) Field of Classification Search
None
See application file for complete search history.

(56) References Cited

U.S. PATENT DOCUMENTS

| | | | |
|---|---|---|---|
| 8,664,636 B2* | 3/2014 | Konsek | H01L 29/0673 257/13 |
| 8,759,814 B2* | 6/2014 | Yang | H01L 33/18 257/103 |
| 8,937,297 B2* | 1/2015 | Gilet | H01L 33/04 257/12 |

(Continued)

FOREIGN PATENT DOCUMENTS

| WO | 2010/134747 | 11/2010 |
| WO | 2011/067872 | 6/2011 |

OTHER PUBLICATIONS

English translation of Notice of Reasons for Rejection of corresponding Japanese Application No. 2014-545173 dated Apr. 28, 2015.

*Primary Examiner* — Bilkis Jahan
(74) *Attorney, Agent, or Firm* — DLA Piper LLP (US)

(57) ABSTRACT

An optoelectronic semiconductor chip includes a multiplicity of active regions, arranged at a distance from one another, and a reflective layer arranged at an underside of the multiplicity of active regions, wherein at least one of the active regions has a main extension direction, one of the active regions has a core region formed with a first semiconductor material, the active region has an active layer, covering the core region at least in directions transversely with respect to the main extension direction of the active region, the active region has a cover layer formed with a second semiconductor material and covers the active layer at least in directions transversely with respect to the main extension direction of the active region, and the reflective layer reflects electromagnetic radiation generated during operation in the active layer.

16 Claims, 9 Drawing Sheets

(51) Int. Cl.

| | | |
|---|---|---|
| *H01L 33/18* | (2010.01) | |
| *H01L 33/24* | (2010.01) | |
| *H01L 27/15* | (2006.01) | |
| *H01L 33/60* | (2010.01) | |
| *H01L 33/08* | (2010.01) | |
| *H01L 33/22* | (2010.01) | |
| *H01L 33/42* | (2010.01) | |
| *H01L 33/46* | (2010.01) | |

(52) U.S. Cl.
CPC ................. *H01L 33/60* (2013.01); *H01L 33/08* (2013.01); *H01L 33/22* (2013.01); *H01L 33/42* (2013.01); *H01L 33/46* (2013.01)

(56) References Cited

U.S. PATENT DOCUMENTS

| | | |
|---|---|---|
| 2007/0041214 A1 | 2/2007 | Ha et al. |
| 2007/0172183 A1* | 7/2007 | Wang ............... B82Y 20/00 385/125 |
| 2008/0036038 A1 | 2/2008 | Hersee |
| 2008/0305568 A1 | 12/2008 | Huang et al. |
| 2010/0327258 A1 | 12/2010 | Lee et al. |
| 2011/0140072 A1 | 6/2011 | Varangis et al. |
| 2011/0233581 A1* | 9/2011 | Sills et al. ............... 257/98 |
| 2011/0240959 A1 | 10/2011 | Konsek et al. |
| 2012/0061646 A1 | 3/2012 | Yi et al. |
| 2012/0235117 A1* | 9/2012 | Fukui et al. ............... 257/13 |

* cited by examiner

RADIATION EMITTING OR RECEIVING OPTOELECTRONIC SEMICONDUCTOR CHIP

TECHNICAL FIELD

This disclosure relates to an optoelectronic semiconductor chip is specified.

BACKGROUND

There is a need to provide an optoelectronic semiconductor chip which can be operated particularly efficiently.

SUMMARY

We provide an optoelectronic semiconductor chip including a multiplicity of active regions arranged at a distance from one another, and a reflective layer arranged at an underside of the multiplicity of active regions, wherein at least one of the active regions has a main extension direction, one of the active regions has a core region formed with a first semiconductor material, the active region has an active layer covering the core region at least in directions transversely with respect to the main extension direction of the active region, the active region has a cover layer formed with a second semiconductor material and covers the active layer at least in directions transversely with respect to the main extension direction of the active region, and the reflective layer reflects electromagnetic radiation generated during operation in the active layer.

We also provide an optoelectronic semiconductor chip including a multiplicity of active regions arranged at a distance from one another, and a reflective layer arranged at an underside of the multiplicity of active regions, wherein at least one of the active regions has a main extension direction, one of the active regions has a core region formed with a first semiconductor material, the active region has an active layer covering the core region at least in directions transversely with respect to the main extension direction of the active region, the active region has a cover layer formed with a second semiconductor material and covers the active layer at least in directions transversely with respect to the main extension direction of the active region, the reflective layer reflects electromagnetic radiation generated during operation in the active layer, at least a large portion of the active regions have a current spreading layer, covering the cover layer at least in directions transversely with respect to the main extension direction, and the current spreading layer is transmissive to electromagnetic radiation generated during operation in the active layer, and an insulation material is arranged between the multiplicity of active regions, and the insulation material is transmissive to electromagnetic radiation generated during operation in the active layer and the insulation material surrounds the active regions at least in directions transversely with respect to the main extension direction.

DETAILED DESCRIPTION

Figure 1:
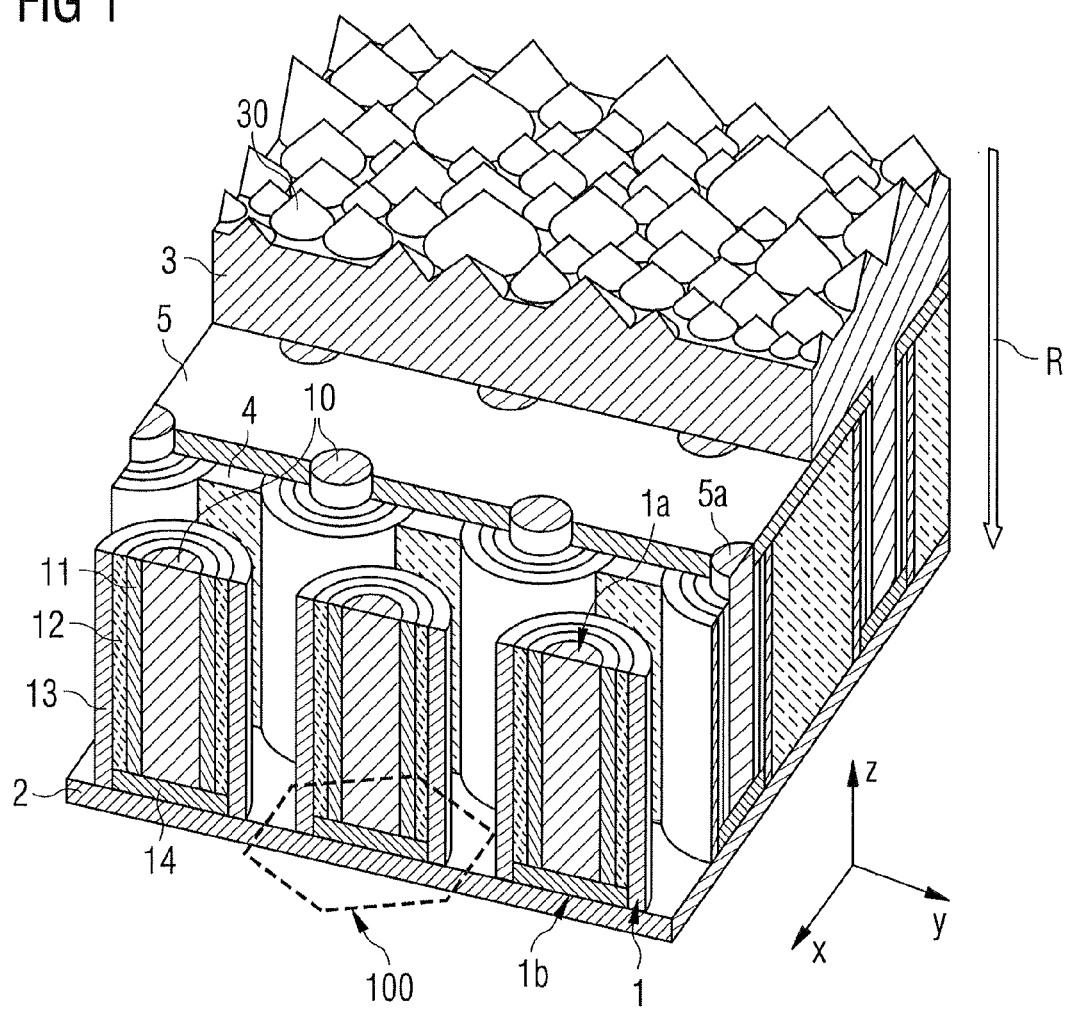
FIG. 1 shows one example of an optoelectronic semiconductor chip in a schematic perspective illustration.

Our optoelectronic semiconductor chip is, in particular, a radiation-emitting optoelectronic semiconductor chip. By way of example, it is an optoelectronic semiconductor chip which emits UV radiation, visible light or infrared radiation during operation. The optoelectronic semiconductor chip is, in particular, a light-emitting diode chip. Furthermore, it is possible for the semiconductor chip to be a radiation-receiving optoelectronic semiconductor chip, for example, a solar cell or a photodiode.

The optoelectronic semiconductor chip may comprise a multiplicity of active regions arranged at a distance from one another. During operation of the optoelectronic semiconductor chip, electromagnetic radiation is generated in the active regions and at least partly leaves the semiconductor chip.

The optoelectronic semiconductor chip comprises a multiplicity of active regions each arranged at a distance from one another. In this case, it is possible for the active regions at an underside and/or at a top side to connect to one another by a further element. In this case, the active regions are spaced apart from one another in a region between their underside and their top side and are not connected to one another there.

The active regions can be arranged, for example, in the manner of a regular lattice. That is to say that the active regions are arranged at predefined distances from one another. By way of example, in a plan view of the top sides of the active regions, a regular lattice structure is discernible such as the structure of a rectangular lattice or of a triangular lattice, for example. However, a random distribution of the active regions is also possible.

The optoelectronic semiconductor chip may comprise a reflective layer arranged at the underside of the multiplicity of active regions. In this case, it is possible for the optoelectronic semiconductor chip to comprise a single reflective layer, which connects all active regions of the optoelectronic semiconductor chip to one another at their underside. In this case, the active regions can directly adjoin the reflective layer at least in places at their undersides.

The reflective layer can be electrically conductive, in particular. The reflective layer then serves for the electrical connection of the active regions at whose underside it is arranged. By way of example, the reflective layer is formed with a metal for this purpose. For example, the reflective layer can contain one of the following metals or consist of one of the following metals: silver, aluminum, chromium, rhodium, nickel, platinum, tungsten, titanium.

Furthermore, it is possible for the reflective layer to be electrically insulating at least in places. The reflective layer can then comprise a dielectric mirror or consist of such a dielectric mirror.

At least one of the active regions may have a main extension direction. That is to say that the active region does not extend to the same extent in every spatial direction. Rather, there is a preferred direction, the main extension direction, in which the active region has its greatest extension.

By way of example, the active region can have the form of a cylinder, the form of a truncated cone or the form of a prism, in particular having a hexagonal or triangular base surface. The main extension direction is then that direction in which the height of the cylinder or of the truncated cone is determined. In other words, the at least one active region is formed by an elongated three-dimensional body and, for example, does not have the form of a sphere or of a cube. Furthermore, the active region is not a continuous unstructured area.

The at least one active region may have a core region formed with a first semiconductor material. In this case, the first semiconductor material has a first conduction type. By way of example, the first semiconductor material is n-conducting. The first semiconductor material can be based, for example, on an n-doped III-V semiconductor material system. By way of example, the first semiconductor material is based on an n-doped nitride semiconductor material system. In particular, the first semiconductor material can then be based on n-conducting GaN, InGaN, AlGaN or AlInGaN.

The core region of the active region extends in particular along the main extension direction and can have the same form as the active region. If the active region is in the form of a cylinder or prism, for example, then the core region can also have the form of a cylinder. The core region can then be, in particular, a solid body consisting of the first semiconductor material.

The at least one active region may comprise an active layer, which covers the core region at least in directions transversely with respect to the main extension direction of the active region. The core region has a lateral surface, for example, which can be covered in particular completely with the material of the active layer. In this case, the core region can directly adjoin the active layer. During operation of the optoelectronic semiconductor chip, the radiation generated by the optoelectronic semiconductor chip is generated in the active region, in particular, in the active layer. The active layer preferably has a uniform thickness within the scope of the production tolerance.

The at least one active region may have a cover layer formed with a second semiconductor material and covers the active layer at least in directions transversely with respect to the main extension direction of the active region. By way of example, the active layer is then arranged between the cover layer and the core region. In this case, the cover layer can completely cover the active layer, in particular. The cover layer preferably has a uniform thickness within the scope of the production tolerance.

The second semiconductor material is a semiconductor material of a second conduction type, which differs from the first conduction type. In particular, the second semiconductor material can be based on the same semiconductor material system as the first semiconductor material, but can in this case have a different doping. If the first semiconductor material is formed in an n-conducting fashion, for example, then the second semiconductor material is formed in a p-conducting fashion. For example, the second semiconductor material is based on p-GaN, p-InGaN, p-AlGaN or p-AlInGaN, if the first semiconductor material is based on n-GaN, n-InGaN, n-AlGaN or n-AlInGaN.

The reflective layer may be designed to reflect electromagnetic radiation generated during operation in the active layer. That is to say that the reflective layer is formed with a material which is reflective for the electromagnetic radiation generated in the active layer, and the reflective layer is arranged such that at least some of the electromagnetic radiation generated by the active layer impinges on the reflective layer. The electromagnetic radiation leaves the optoelectronic semiconductor chip, for example, at a side lying at a side of the active region facing away from the reflective layer.

The semiconductor chip may comprise a multiplicity of active regions arranged at a distance from one another. Furthermore, the optoelectronic semiconductor chip comprises a reflective layer arranged at an underside of the multiplicity of active regions. In this case, at least one of the active regions has a main extension direction, the active region has a core region formed with a first semiconductor material, the active region has an active layer covering the core region at least in directions transversely with respect to the main extension direction of the active region, the active region has a cover layer formed with a second semiconductor material and covers the active layer at least in a direction being transverse to the main extension direction of the active region, and the reflective layer reflects electromagnetic radiation generated during operation in the active layer.

In this case, the optoelectronic semiconductor chip preferably comprises a multiplicity of active regions constructed in an identical type of fashion, for example. These active regions can then be identically within the scope of the production tolerance. That is to say that each of the active regions then comprises a core region, an active layer and a cover layer, which have a respectively identical material composition within the scope of the production tolerance. In particular, it is possible for all active regions of the optoelectronic semiconductor chip to be identically within the scope of the production tolerance. However, it is also possible for the optoelectronic semiconductor chip to comprise a multiplicity of active regions that are different at least in part. For example, the active regions can differ from one another with regard to thickness and composition. Thus, different active regions can emit light of different colors such that the semiconductor chip emits, for example, white light overall.

Preferably, all active regions of the semiconductor chip are based on a III-V semiconductor material system, in particular, on a nitride compound semiconductor material.

"Based on nitride compound semiconductor material" means that the active regions comprise or consist of a nitride compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can comprise, for example, one or a plurality of dopants and additional constituents. For the sake of simplicity, however, the above formula includes only the essential constituents of the crystal lattice (Al, Ga, In, N), even if these can be replaced and/or supplemented in part by small amounts of further substances.

The efficiency of, in particular, GaN-based light-emitting diodes is limited under operating current conditions by the so-called "droop" effect. This effect denotes a significant drop in efficiency as the current or charge carrier density rises. Typical operating currents are therefore distinctly beyond the maximum of the efficiency curve. To advance to higher efficiencies with the current remaining constant, a reduction of the local charge carrier density is therefore advantageous. This could be achieved, for example, by enlarging the cross-sectional area of the optoelectronic semiconductor chip or by increasing the number of active layers. Both approaches have problems, however.

In this regard, enlarging the cross-sectional area is impracticable for many applications, for example, the use of the optoelectronic semiconductor chip in a projection apparatus, since this enlargement is accompanied by an increase in the etendue. Moreover, this solution is also always associated with an increase in costs disproportional to the increase in the cross-sectional area of the semiconductor chip.

Increasing the number and/the thickness of the active layer is limited by the fact that barriers between the layers, brought about in particular by piezo-fields, impede the charge carrier transport and thus counteract a uniform energization of all the layers.

In the case of the optoelectronic semiconductor chip described here, the active regions are, for example, "core-shell nano- or microrods". As a result of the radiation-emitting region of the optoelectronic semiconductor chip being divided into a multiplicity of active regions, that is to say, for example, a multiplicity of core-shell nanorods, the surface area through which electromagnetic radiation generated during operation in the semiconductor chip emerges from the active layers is increased relative to an optoelectronic semiconductor chip comprising a single active region that is unstructured, for example. The efficiency of the semiconductor chip is increased in this way.

The reflective layer at an underside of the active regions also contributes directly to increasing the efficiency since the electromagnetic radiation generated during operation can be directed in a preferred direction by the reflective layer.

On account of the fact that an optoelectronic semiconductor chip comprises a multiplicity of active regions, a significant enlargement of the active area and thus an increase in efficiency under operating current conditions in conjunction with a reduced charge carrier density are achieved. Furthermore, in the course of the epitaxial growth of the active regions, which are at a distance from one another, by comparison with a closed two-dimensional layer, it is possible to achieve a reduction of strains in the semiconductor material of the active regions.

In particular, it is possible for an optoelectronic semiconductor chip to comprise more than 1000, preferably more than 10 000, in particular more than 100 000 or more than 1 million, active regions.

The first semiconductor material may be deposited epitaxially onto a growth substrate, wherein the optoelectronic semiconductor chip itself no longer has a growth substrate and is therefore free of a growth substrate. In other words, the growth substrate is removed from the epitaxially deposited layers of the optoelectronic semiconductor chip after completion of the active regions. This is a feature which characterizes the optoelectronic semiconductor chip as subject matter since, by analyzing the optoelectronic semiconductor chip, it is possible to demonstrate that the growth substrate was removed from the epitaxially deposited layers.

The growth direction of the first semiconductor material may run substantially parallel to the main extension direction. That is to say that, within the scope of the production tolerance, the growth direction of the first semiconductor material runs parallel to the main extension direction. The growth direction of the active region can run on the upper end of the core region optionally longitudinally with respect to the main extension direction. The first semiconductor material of the core region of the at least one active region is therefore grown in the main extension direction. The active layer and the cover layer of the active region cover the core region in directions that run transversely with respect to the growth direction of the semiconductor material of the core region.

The active region may have a length determined in the main extension direction. That is to say that the length of the active region is measured along the main extension direction. Furthermore, the active region has a diameter determined in a direction perpendicular to the main extension direction, that is to say running in a plane to which the main extension direction is perpendicular. The diameter can vary along the main extension direction. The ratio of length to maximum diameter of the active region, preferably of all the active regions of the optoelectronic semiconductor chip, is in this case at least three, in particular at least five, for example, between at least five and at most 20.

In this case, the diameter of the active region can be between at least 100 nm and at most 25 µm. With regard to improving the material quality, in particular with regard to reducing dislocations in the semiconductor material of the active region, active regions having a diameter of at least 100 nm and at most 3 µm, in particular at most 1 µm, prove to be particularly advantageous. In the case of such thin active regions, dislocations generally do not pervade the active region along its entire length, but rather—on account of the small thickness—end after relatively short path lengths at a lateral surface of the active region, without extending over the entire active region. Furthermore, it is possible for the dislocations to extend along the entire length of the core region of the active region, but not to penetrate through the active layer on the outer surface of the core region.

In this case, the active regions are preferably arranged with high density that is to say with a high filling factor. In this case, the filling factor corresponds to the ratio of the area of the reflective layer adjoining the active regions to the total area of the top side of the reflective layer assigned to the active regions. The filling factor is preferably at least 20%, in particular at least 50%, for example at least 75%. A particularly significant enlargement of the active area of the optoelectronic semiconductor chip is achieved as a result.

The active region may have a current spreading layer covering the cover layer at least in directions transversely with respect to the main extension direction, wherein the current spreading layer is transmissive for electromagnetic radiation generated during operation in the active layer. The current spreading layer serves to distribute an electric current particularly uniformly over the cover layer. In this case, the current spreading layer is in particular in direct contact with the cover layer and can cover the latter completely. If the cover layer is formed with a p-conducting nitride compound semiconductor material, for example, then it has a relatively low transverse conductivity. The current spreading layer therefore leads to a more uniform energization of the active layer of the active region. The current spreading layer covers the cover layer preferably as a layer having a uniform thickness within the scope of the production tolerance.

The current spreading layer is transmissive to electromagnetic radiation generated in the active region. That is to say that the current spreading layer is radiation-transmissive.

"Radiation-transmissive" means that the radiation-transmissive component allows at least 75% of the electromagnetic radiation of the active layer that enters it to pass through without absorbing said radiation. In this case, the radiation-transmissive component can be milky, cloudy or pellucid, transparent.

The current spreading layer may be formed with a transparent conductive oxide (TCO). By way of example, materials such as ITO or ZnO are suitable to form the current spreading layer.

The current spreading layer may extend over at least a large portion of the length of the active region. In particular, it is possible for the current spreading layer to uniformly cover and in this case completely cover the cover layer over the entire length of the active region.

An insulation material may be arranged between the multiplicity of active regions, wherein the insulation material is transmissive to electromagnetic radiation generated during operation in the active layer, and the insulation material surrounds the multiplicity of active regions at least in directions transversely with respect to the main extension direction. In other words, the insulation material is filled into the interspaces between the active regions and the insulation material can fill, in particular completely fill, the interspaces. In this case, the insulation material is electrically insulating and radiation-transmissive. By way of example, materials such as aluminum oxide ($AlO_x$), silicon dioxide, silicon nitride or polymers are suitable as insulation materials.

Besides an electrical decoupling of the individual active regions, the insulation material provides for protection of the active regions against mechanical damage, atmospheric gases and moisture. Furthermore, the insulation material can be used as a planarization layer to which the reflective layer is applied at least in places. For example, the insulation material for this purpose terminates flush with the active regions at the underside thereof. In this way, the reflective layer can be applied to a smooth area formed by the undersides of the active regions and the insulation material.

The insulation material may directly adjoin the outer surface of the active region at least in places. For example, the insulation material completely covers the lateral surface of each active region and there directly adjoins the outermost layer of the active region, in particular the current spreading layer. In this case, the insulation material embeds into the active regions.

A mask layer may be arranged at that side of the multiplicity of active regions facing away from the reflective layer, wherein the mask layer has for each of the active regions an opening penetrated by the first semiconductor material. To produce the active regions, for example, a mask layer is applied to a layer composed of first semiconductor material. The mask layer has openings to the layer composed of first semiconductor material. The first semiconductor material forming the core region of each active region then grows onto the layer composed of first semiconductor material only in the region of the openings. The form and the diameter of the openings in the mask layer determine the form of the cross section and the diameter of the core region of each active region. The mask layer remains in the completed optoelectronic semiconductor chip. Its openings are penetrated by first semiconductor material.

The mask layer may be transmissive to electromagnetic radiation generated during operation in the active layer. For this purpose, the mask layer can be formed, for example, from the same material as the insulation layer.

A coupling-out layer formed with the first semiconductor material may be arranged at that side of the multiplicity of active regions facing away from the reflective layer. The coupling-out layer is, for example, that layer composed of first semiconductor material to which the mask layer is applied and onto which—in the openings of the mask layer—the core regions of the active regions are grown epitaxially. During operation of the optoelectronic semiconductor chip, a large portion, that is to say at least 50%, in particular at least 75%, of the electromagnetic radiation emitted by the optoelectronic semiconductor chip is coupled out from the semiconductor chip through the coupling-out layer. In this case, the coupling-out layer can have a regular or an irregular structuring at its side facing away from the reflective layer, which structuring increases the probability of the coupling-out.

The first semiconductor material of the coupling-out layer may connect to the first material in the core region of the active regions through the openings in the mask layer. That is to say that the core regions of the active regions are monolithically integrated with the coupling-out layer.

The active region may have a passivation layer at its underside facing the reflective layer, the passivation layer directly adjoining the reflective layer and the core region of the active region. In other words, the cover layer and the active layer, if appropriate also the current spreading layer, can be removed at the underside of the active region. As a result, it is possible, for example, for the active regions to be contact-connected on the n-side by the reflective layer. A contact-connection of the p-side of the active regions can then be effected by a contact-connection of the current spreading layer, for example. In this way, it is possible for that side of the coupling-out layer facing away from the reflective layer to be free of a contact material for the connection of the semiconductor chip.

Our optoelectronic semiconductor chip and methods of producing it as described here are explained in greater detail below in conjunction with examples and the associated figures.

In the figures, identical or identically acting constituent parts may in each case be provided with the same reference signs. The illustrated constituent parts and their size relationships among one another should not be regarded as true to scale, in principle. Rather, individual constituent parts such as, for example, layers, structures, components and regions may be illustrated with exaggerated thickness or size dimensions to enable better illustration and/or to afford a better understanding.

FIG. 1 shows a schematic perspective illustration of a first example of an optoelectronic semiconductor chip. The optoelectronic semiconductor chip comprises a multiplicity of active regions 1. The active regions 1 each have the form of a cylinder. Each active region 1 extends along the main extension direction R. The active regions 1 are arranged at the lattice points of a regular lattice, a triangular lattice in the present case. A unit cell 100 of the lattice is indicated in FIG. 1.

Each of the active regions comprises a core region 10. The core region 10 is formed with an n-doped GaN-based first semiconductor material. The core region 10 likewise is in the form of a cylinder. The lateral surface of the cylinder is completely covered by the active layer 11, in which electromagnetic radiation is generated during operation of the optoelectronic semiconductor chip.

The active layer 11 is in the form of a hollow cylinder, the inner surface of which is completely covered with the first semiconductor material of the core region 10. The outer surface of the active layer 11 is completely covered by a cover layer 12 formed with a p-doped GaN-based second semiconductor material in the example in FIG. 1.

The outer surface of the cover layer 12 facing away from the active layer 11 is completely covered with the current spreading layer 13. The current spreading layer 13 is radiation-transmissive to electromagnetic radiation generated in the active layer 11 and consists of a TCO material, for example, ITO.

Interspaces between the active regions 1 are filled with an insulation material 4, which directly adjoins the outer surface of the current spreading layer 13 facing away from the core region 10. The insulation material 13 is transmissive to electromagnetic radiation generated in the active layer 11 and is electrically insulated. By way of example, the insulation material 4 consists of silicon dioxide. The insulation material 4 can be applied, for example, by spin-coating, vapor deposition, sputtering, ALD or CVD.

Each active region 1 has a passivation layer 14 at is underside 1a, which passivation layer encloses the core region 10 in a ring-shaped manner and directly adjoins the first semiconductor material of the core region 10. In the region of the passivation layer 14, the core region 10, the active layer 11 and the cover layer 12 are removed or neutralized, for example, by ion implantation. In this case, the p-side can be contact-connected by the largely spreading metal contact of the reflective layer 2. Alternatively, in the region of the passivation layer 14, the active layer 11, the cover layer 12 and the current spreading layer 13 can be removed or neutralized, for example, by ion implantation. In this case, the n-side connects via the reflective layer.

The passivation layer 14 can be formed with an electrically insulating material and consists of the insulation material 4, for example. Furthermore, it is possible for the passivation layer 14 to be produced by neutralization of semiconductor material.

A reflective layer 2 is arranged at the underside 1a of the active regions 1. The reflective layer 2 is provided to reflect electromagnetic radiation generated in the active layer 11. In this case, the reflective layer 2 is preferably electrically conductive and serves for the electrical connection of the active regions 1. On account of the presence of the passivation layer 14, the reflective layer 2 connects the p-conducting cover layer 12 and the current spreading layer 13. By way of example, the reflective layer 2 consists of silver.

A mask layer 5 is arranged at that side of the active regions 1 facing away from the reflective layer 2. The mask layer 5 is formed with a material transmissive to the electromagnetic radiation generated in the active layer 11 during operation. Furthermore, the mask layer 5 is preferably electrically insulating. For this purpose, the mask layer 5 can consist of silicon dioxide or silicon nitride, for example. The mask layer 5 has openings 5a, the number of which corresponds to the number of active regions 1 to the greatest possible extent. Through the openings 5a, the core region 10 of each active region 1 connects to a coupling-out layer 3.

The coupling-out layer 3 is formed with the same semiconductor material as the core regions 10 of the active regions 1. The core regions 10 of the active regions 1 are grown epitaxially on the mask layer 5. In the openings 5a, the core regions 10, as a result of the epitaxial growth, are mechanically fixedly connected to the likewise epitaxially grown semiconductor material of the coupling-out layer 3. The growth direction z of the epitaxial growth of the coupling-out layer 3 and of the core regions 10 is parallel to the main extension direction R of the active regions 1. The active regions 1 are arranged at a distance from one another in the plane x, y perpendicular to the main extension direction R.

At its side facing away from the mask layer 5, the coupling-out layer 3 has coupling-out structures 30 formed by a random structuring of the semiconductor material of the coupling-out layer 3. By way of example, this random structuring is produced by etching by KOH.

The diameter of the active regions 1 in the plane x, y is, for example, 150 nm. The length of the active regions 1 is, for example, 1.5 μm in the main extension direction R. During operation of the optoelectronic semiconductor chip, electromagnetic radiation having a wavelength of 440 nm is generated, for example, in the active layer 11.

With reference to the schematic sectional illustrations in FIGS. 2A to 2M, a method of producing an optoelectronic semiconductor chip is explained in greater detail.

Figure 2A:
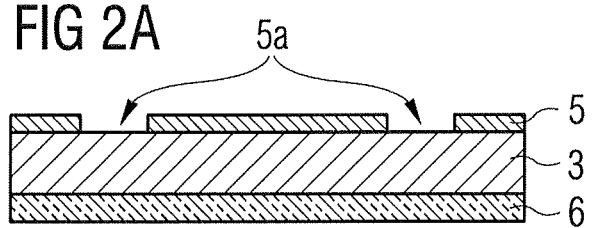
FIGS. 2A to 2M show schematic sectional illustrations of a method of producing an optoelectronic semiconductor chip.

FIG. 2A schematically shows a growth substrate 6 onto which the coupling-out layer 3 formed with a first semiconductor material is deposited epitaxially. The radiation-transmissive mask layer 5 with the openings 5a is applied to that surface of the coupling-out layer 3 facing away from the growth substrate 6.

Figure 2B:
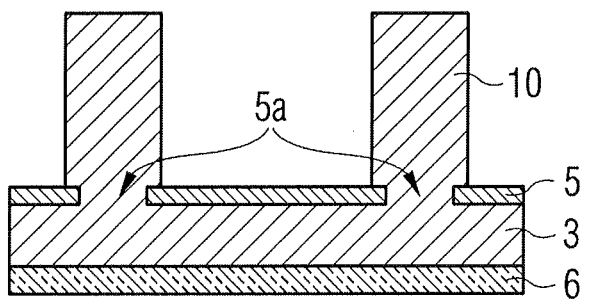

In conjunction with FIG. 2B the illustration shows that afterward the core regions 10, which are likewise formed with the first semiconductor material, are deposited epitaxially onto the mask layer 5 and grow onto the material of the coupling-out layer 3 only in the region of the openings 5a. Cylindrical or prism-shaped core regions 10 arise, for example.

Figure 2C:
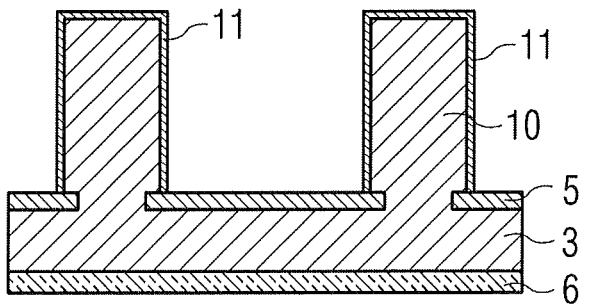

The active layer 11 is in each case deposited epitaxially onto the outer surface of the core regions 10. The active layer 11 later constitutes the active shell of the active region 1, as shown in FIG. 2C.

Figure 2D:
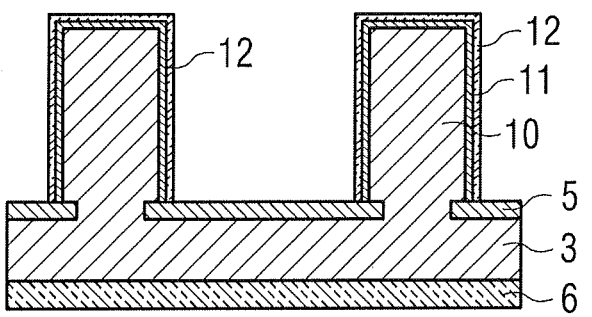

In the next method step, FIG. 2D, the cover layer 12 is deposited epitaxially onto the active layer 11 of each active region 1. The cover layer 12 completely covers the active layer 11.

Figure 2E:
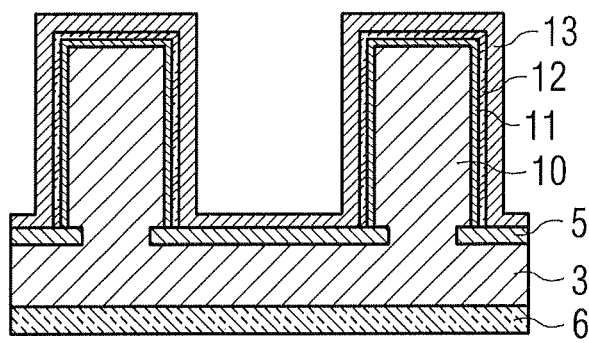

In the subsequent method step, FIG. 2E, the current spreading layer 13 is deposited onto the cover layer 12, for example, by sputtering or vapor deposition.

Figure 2F:
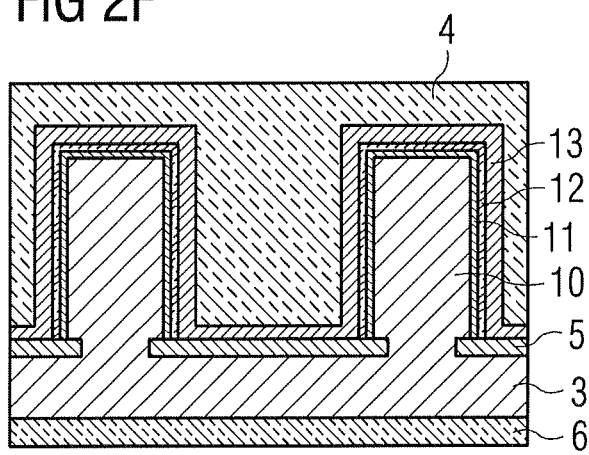

In the method step illustrated in FIG. 2F, the insulation material 4 is formed over the active regions 1 produced in this way. In this case, the insulation material 4 fills interspaces between the active regions 1 spaced apart from one another and also covers the active regions 1 at their surface facing away from the growth substrate 6.

Figure 2G:
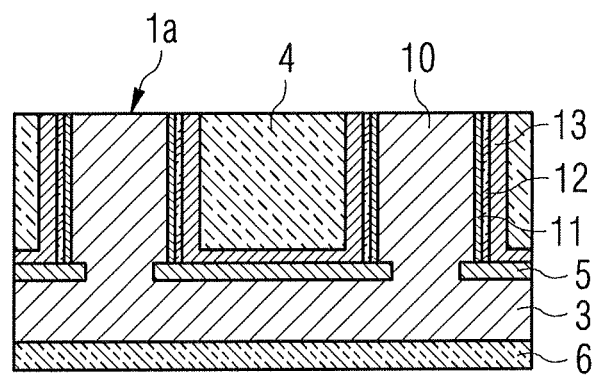

In the next method step, FIG. 2G, the active regions 1 are exposed by removal of the insulation material 4. In this case, the active layer 11, the cover layer 12 and the current spreading layer 13 are also removed at that side of the active regions 1 facing away from the growth substrate 6, with the result that the core regions 10 of the active regions 1 are exposed. In this case, the material removal can be effected by means of etching and/or chemical mechanical polishing, for example.

Figure 2H:
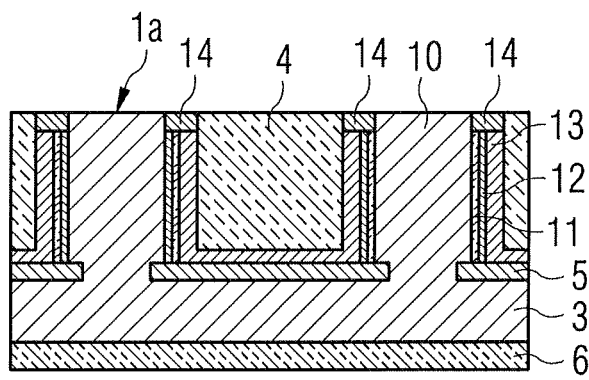

The electrically insulating passivation layer 14 is produced in a ring-shaped region of each active region FIG. 2H.

Figure 2I:
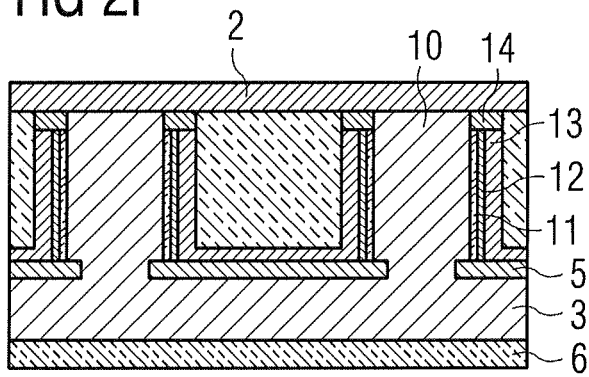
Figure 2J:
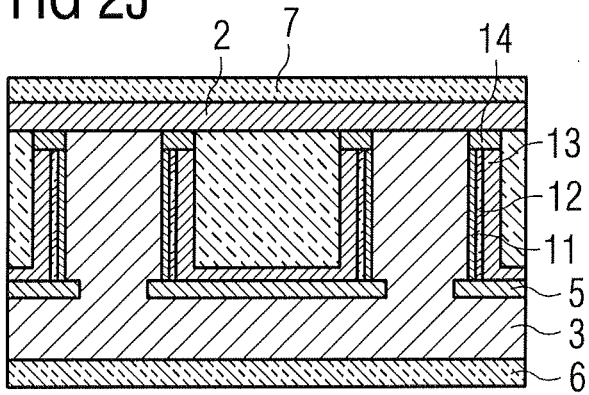

Afterward, in FIG. 2I, the reflective layer 2 is applied to that side of the active regions 1 and of the insulation material 4 facing away from the growth substrate 6. Afterward, in FIG. 2J, a carrier 7 is applied to that side of the reflective layer 2 facing away from the growth substrate 6.

Figure 2K:
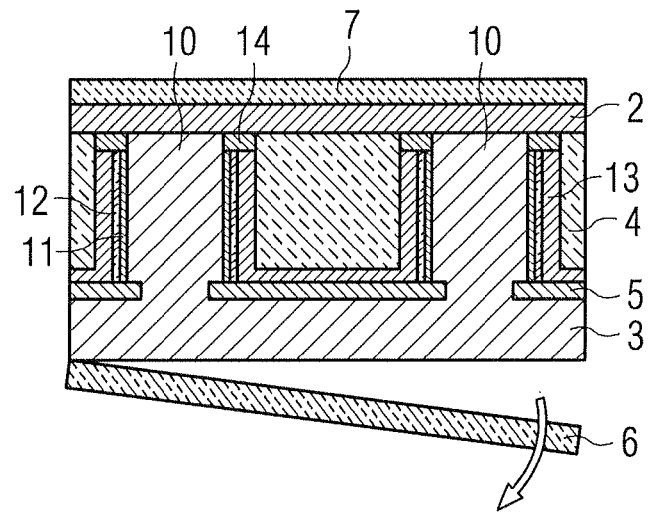

FIG. 2K shows that the growth substrate 6 is subsequently removed. When the growth substrate 6 consists of sapphire, this can be effected by a laser lift-off method. When the growth substrate 6 is formed with silicon, chemical etching can also be effected to strip away the growth substrate 6.

Figure 2L:
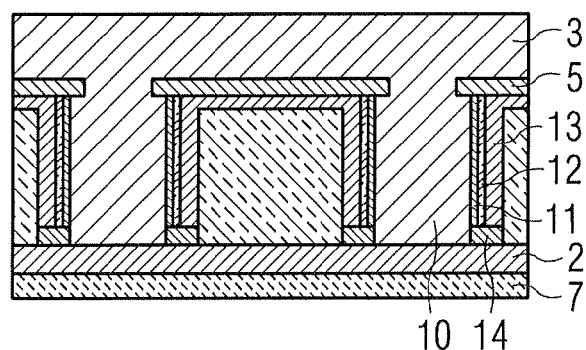

This results in a structure, FIG. 2L, which is free of a growth substrate 6.

Figure 2M:
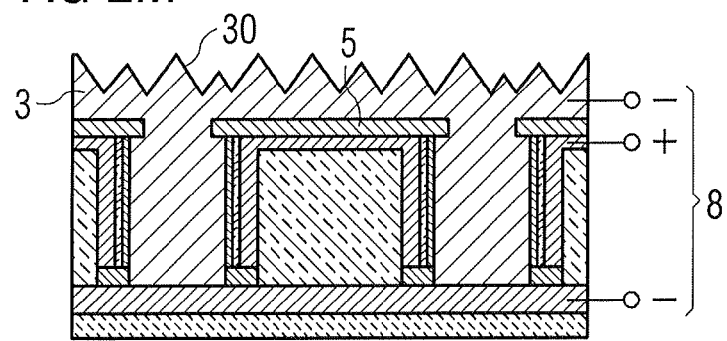

Finally, in FIG. 2M, the coupling-out structures 30 can be produced by etching, for example. The optoelectronic semiconductor chip produced in this way can be provided with connections 8.

With reference to the schematic sectional illustrations in FIGS. 3A to 3L, a further method of producing an optoelectronic semiconductor chip is explained in greater detail.

Figure 3A:
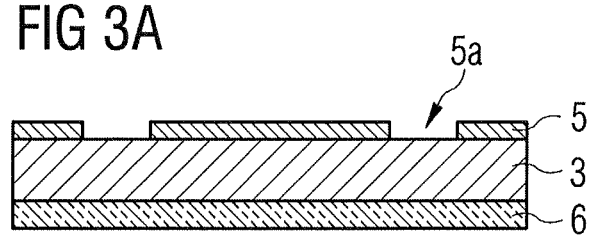
FIGS. 3A to 3L show schematic sectional illustrations of a further method of producing an optoelectronic semiconductor chip.

FIG. 3A schematically shows a growth substrate 6 onto which the coupling-out layer 3 formed with an n-doped first semiconductor material is deposited epitaxially. The radiation-transmissive mask layer 5 with the openings 5a is applied to that surface of the coupling-out layer 3 facing away from the growth substrate 6.

Figure 3B:
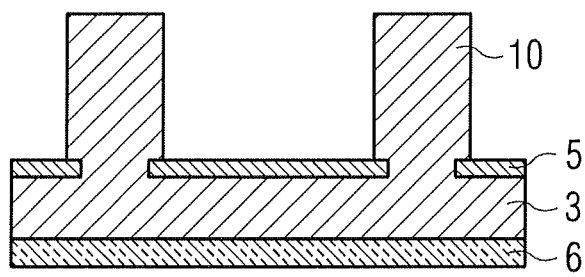

FIG. 3B shows that, afterward, the core regions 10, which are likewise formed with the first semiconductor material, are deposited epitaxially onto the mask layer 5 and grow onto the material of the coupling-out layer 3 only in the region of the openings 5a. Cylindrical or prism-shaped core regions 10 arise, for example.

Figure 3C:
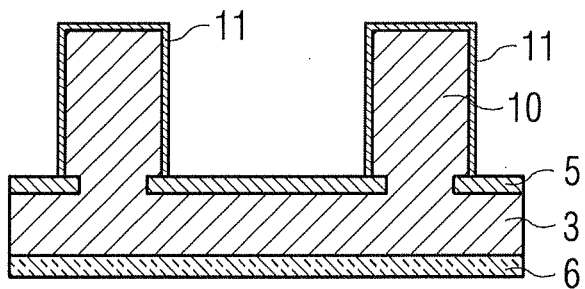

The active layer 11 is in each case deposited epitaxially onto the outer surface of the core regions 10. The active layer 11 later constitutes the active shell of the active region 1, as shown in FIG. 3C.

Figure 3D:
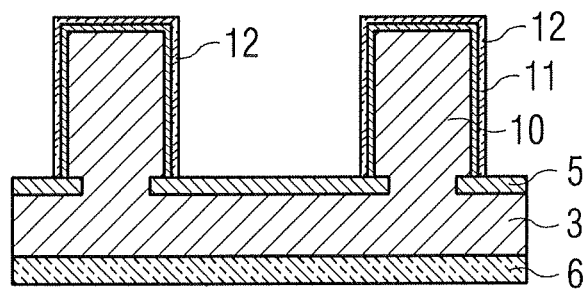

In the next method step, FIG. 3D, the cover layer 12 is deposited epitaxially onto the active layer 11 of each active region 1. The cover layer 12 completely covers the active layer 11.

Figure 3E:
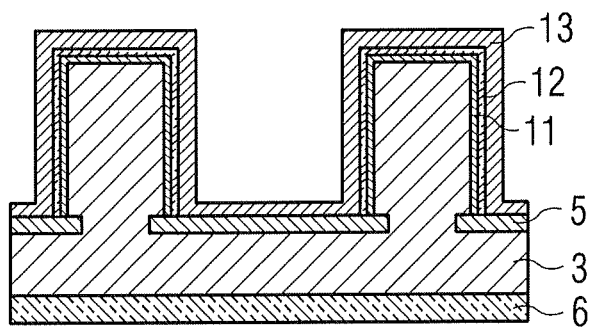

In the subsequent method step, FIG. 3E, the current spreading layer 13 is deposited onto the cover layer 12, for example, by sputtering.

Figure 3F:
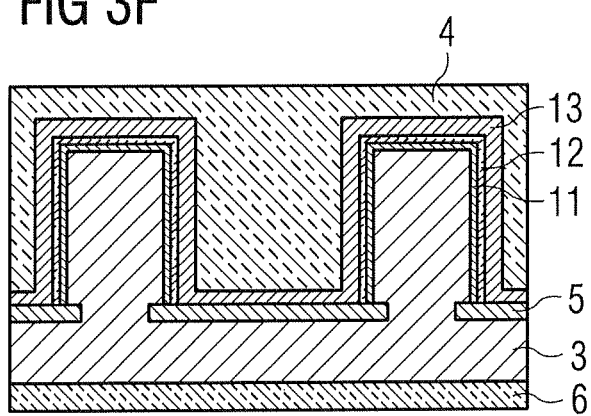

In the method step illustrated in FIG. 3F, the insulation material 4 is formed over and/or around the active regions 1 which have been produced. In this case, the insulation material 4 fills interspaces between the active regions 1 spaced apart from one another and also covers the active regions 1 at their surface facing away from the growth substrate 6.

Figure 3G:
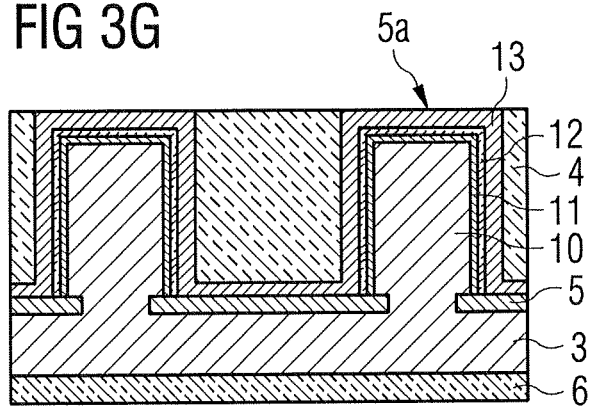

In the subsequent method step, FIG. 3G, in contrast to the previous method, now the core region 10 of the active regions 1 is not exposed, rather the insulation material 4 is removed until the current spreading layer 13 is exposed.

Figure 3H:
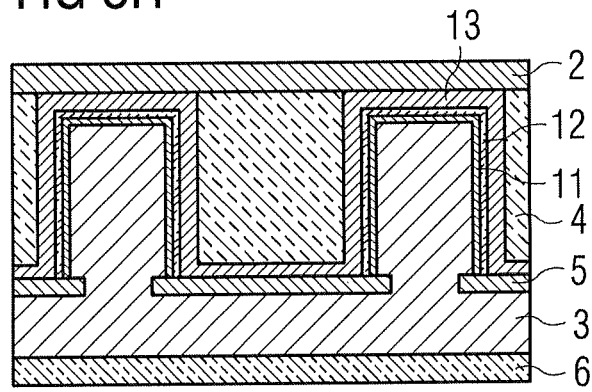

In the method step in FIG. 3H, the reflective layer 2 is applied to that side of the active regions 1 and of the insulation material 4 facing away from the growth substrate 6. The reflective layer 2 is thus electrically conductively connected to the current spreading layer 13 and, in contrast to the example in FIG. 2, connects the p-side of the active regions 1.

Figure 3I:
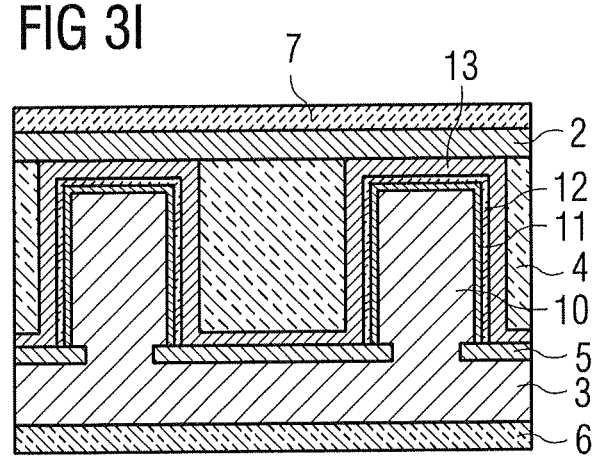

Afterward, in FIG. 3I, a carrier 7 is applied to that side of the reflective layer 2 facing away from the growth substrate 6.

Figure 3J:
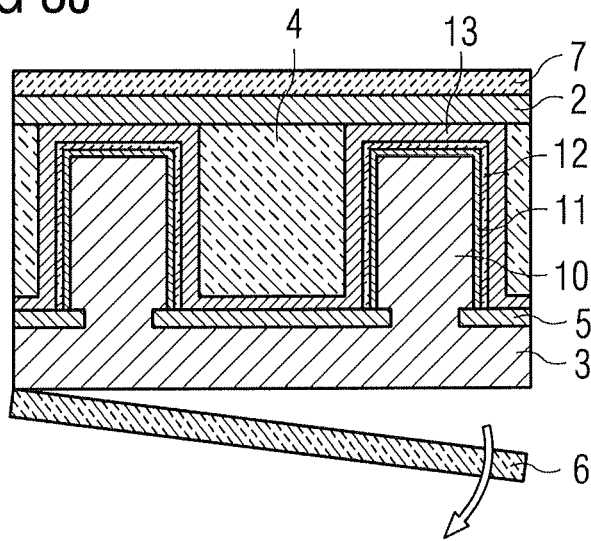

FIG. 3J shows that the growth substrate 6 is subsequently removed. When the growth substrate 6 consists of sapphire, this can be effected by a laser lift-off method. When the growth substrate 6 is formed with silicon, chemical etching can also be effected to strip away the growth substrate 6.

Figure 3K:
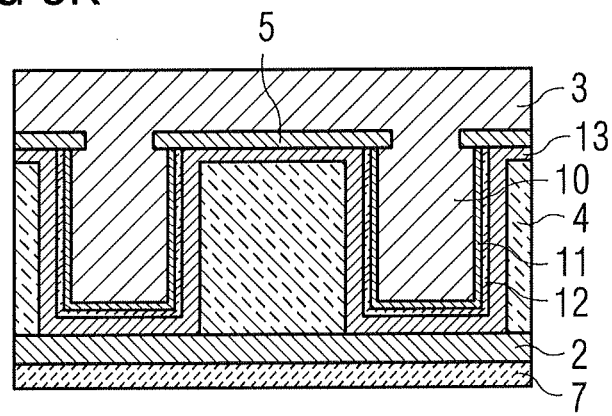

This results in a structure, FIG. 3K, which is free of a growth substrate 6.

Figure 3L:
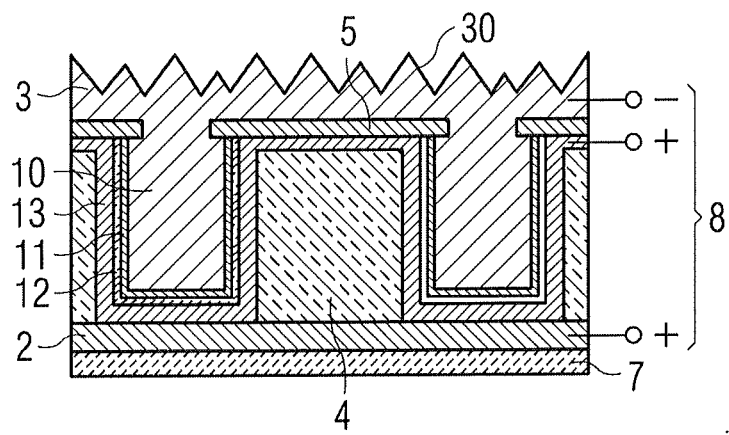

Finally, in FIG. 3L, the coupling-out structures 30 can be produced by etching, for example. The optoelectronic semiconductor chip produced in this way can be provided with connections 8.

As an alternative to the epitaxial growth of the core regions 10 through the openings 5a of the mask layer 5, the core region 10 can also be produced by a structuring such as an etching, for example, of a previously grown, closed layer. The masking layer 5 between coupling-out layer 3 and active regions 1 is then not present, but can be replaced by a passivation layer applied subsequently. Optionally, the structure is annealed, for example, by wet-chemical KOH treatment to improve the material quality of the core regions thus produced. Subsequent, optional, overgrowth with first semiconductor material, with active layer 11 and cover layer 12 is then effected as described above.

Our chips and methods are not restricted to the examples by the description examples, but rather encompass any novel feature and also any combination of features, which includes in particular any combination of features in the appended claims, even if the features or combinations themselves are not explicitly specified in the claims or examples.

The invention claimed is:

1. An optoelectronic semiconductor chip comprising:
a multiplicity of active regions arranged at a distance from one another, and
a reflective layer arranged at an underside of the multiplicity of active regions, wherein
at least one of the active regions has a main extension direction,
one of the active regions has a core region formed with a first semiconductor material,
the active region has an active layer covering the core region at least in directions transversely with respect to the main extension direction of the active region,
the active region has a cover layer formed with a second semiconductor material and covers the active layer at least in directions transversely with respect to the main extension direction of the active region,
the reflective layer reflects electromagnetic radiation generated during operation in the active layer, and
an insulation material is arranged between the multiplicity of active regions, is transmissive to electromagnetic radiation generated during operation in the active layer, and surrounds the active regions at least in directions transversely with respect to the main extension direction.

2. The optoelectronic semiconductor chip according to claim 1, wherein
the active regions are based on a nitride compound semiconductor material,
the first semiconductor material is deposited epitaxially onto a growth substrate, and the optoelectronic semiconductor chip is free of the growth substrate,
a growth direction of the first semiconductor material is substantially parallel to the main extension direction,
at least a large portion of the active regions have a length determined in the main extension direction and have a diameter determined in a plane perpendicular to the main extension direction, and the ratio of length to diameter is at least three,
at least a large portion of the active regions have a current spreading layer covering the cover layer at least in directions transversely with respect to the main extension direction, and the current spreading layer is transmissive to electromagnetic radiation generated during operation in the active layer,
the current spreading layer is formed with a transparent conductive oxide,
the current spreading layer extends over at least a large portion of the length of the active region,
an insulation material is arranged between the multiplicity of active regions, and the insulation material is transmissive to electromagnetic radiation generated during operation in the active layer and the insulation material surrounds the active regions at least in directions transversely with respect to the main extension direction,
the insulation material directly adjoins the current spreading layer at least in places,
the reflective layer directly adjoins the insulation material in places, and
at least a large portion of the active regions have a passivation layer at their underside facing the reflective layer, said passivation layer directly adjoining the reflective layer and the core region of the active region.

3. The optoelectronic semiconductor chip according to claim 1, wherein the first semiconductor material is epitaxially deposited onto a growth substrate, and the optoelectronic semiconductor chip is free of the growth substrate.

4. The optoelectronic semiconductor chip according to claim 1, wherein a growth direction of the first semiconductor material is substantially parallel to the main extension direction.

5. The optoelectronic semiconductor chip according to claim 1, wherein the active region has a length determined in the main extension direction, the active region has a diameter determined in a plane being perpendicular to the main extension direction, and the ratio of length to diameter is at least three.

6. The optoelectronic semiconductor chip according to claim 1, wherein the current spreading layer is formed with a transparent conductive oxide.

7. The optoelectronic semiconductor chip according to claim 1, wherein the active region has a length determined in the main extension direction and the current spreading layer extends over at least a large portion of the length of the active region.

8. The optoelectronic semiconductor chip according to claim 1, wherein the insulation material directly adjoins an outer surface of the active region at least in places.

9. The optoelectronic semiconductor chip according to claim 1, wherein the active region has a current spreading layer covering the cover layer at least in directions transversely with respect to the main extension direction and the insulation material directly adjoins the current spreading layer at least in places.

10. The optoelectronic semiconductor chip according to claim 1, wherein the reflective layer directly adjoins the insulation material in places.

11. The optoelectronic semiconductor chip according to claim 1, wherein the mask layer is transmissive to electromagnetic radiation generated during operation in the active layer.

12. The optoelectronic semiconductor chip according to claim 1, wherein a coupling-out layer is arranged at a side of the multiplicity of active regions facing away from the reflective layer, said coupling-out layer being formed with the first semiconductor material.

13. The optoelectronic semiconductor chip according to claim 1, wherein
   a coupling-out layer is arranged at a side of the multiplicity of active regions facing away from the reflective layer, said coupling-out layer being formed with the first semiconductor material, and
   the first semiconductor material of the coupling-out layer connects to the first semiconductor material in the core regions of the active regions through the openings in the mask layer.

14. The optoelectronic semiconductor chip according to claim 1, wherein the active region has a passivation layer at its underside facing the reflective layer, said passivation layer directly adjoining the reflective layer and the core region of the active region.

15. An optoelectronic semiconductor chip comprising:
   a multiplicity of active regions arranged at a distance from one another, and
   a reflective layer arranged at an underside of the multiplicity of active regions, wherein
   at least one of the active regions has a main extension direction,
   one of the active regions has a core region formed with a first semiconductor material,
   the active region has an active layer covering the core region at least in directions transversely with respect to the main extension direction of the active region,
   the active region has a cover layer formed with a second semiconductor material and covers the active layer at least in directions transversely with respect to the main extension direction of the active region,
   the reflective layer is configured to reflect electromagnetic radiation generated during operation in the active layer, and
   the active region has a current spreading layer covering the cover layer at least in directions transversely with respect to the main extension direction, and the current spreading layer is transmissive to electromagnetic radiation generated during operation in the active layer.

16. An optoelectronic semiconductor chip comprising:
   a multiplicity of active regions arranged at a distance from one another, and
   a reflective layer arranged at an underside of the multiplicity of active regions, wherein
   at least one of the active regions has a main extension direction,
   one of the active regions has a core region formed with a first semiconductor material,
   the active region has an active layer covering the core region at least in directions transversely with respect to the main extension direction of the active region,
   the active region has a cover layer formed with a second semiconductor material and covers the active layer at least in directions transversely with respect to the main extension direction of the active region,
   the reflective layer is configured to reflect electromagnetic radiation generated during operation in the active layer, and
   a mask layer is arranged at a side of the multiplicity of active regions facing away from the reflective layer, and the mask layer has, for each of the active regions, an opening through which the first semiconductor material penetrates.

* * * * *